United States Patent
Fonteneau et al.

(10) Patent No.: US 7,564,936 B2
(45) Date of Patent: Jul. 21, 2009

(54) PROCESS AND ELECTRONIC DECODING CIRCUIT FOR A DIPHASE ASYNCHRONOUS FRAME WHOSE LENGTH IS NOT KNOWN IN ADVANCE, CORRESPONDING APPLICATION, COMPUTER PROGRAMME AND STORAGE MEANS

(75) Inventors: Eric Fonteneau, Sucé sur Erdre (FR); Virginie Klingler, Nantes (FR)

(73) Assignee: Atmel Nantes SA, Nantes (FR)

( * ) Notice: Subject to any disclaimer, the term of this patent is extended or adjusted under 35 U.S.C. 154(b) by 928 days.

(21) Appl. No.: 10/993,690

(22) Filed: Nov. 19, 2004

(65) Prior Publication Data

US 2005/0175134 A1  Aug. 11, 2005

(30) Foreign Application Priority Data

Nov. 21, 2003  (FR)  ................................ 03 13689
Jun. 21, 2004  (FR)  ................................ 04 06746

(51) Int. Cl.
*H04L 7/02*  (2006.01)
(52) U.S. Cl. ...................... 375/361; 709/200
(58) Field of Classification Search .................. 375/316
See application file for complete search history.

(56) References Cited

U.S. PATENT DOCUMENTS

| 4,241,398 A | 12/1980 | Carll | |
|---|---|---|---|
| 5,754,764 A * | 5/1998 | Davis et al. | ................. 709/200 |
| 2004/0225811 A1* | 11/2004 | Fosler | ........................ 710/305 |

FOREIGN PATENT DOCUMENTS

EP  0 245 972  4/1987

OTHER PUBLICATIONS

Sastry et al. "A Low Cost Optical Slotted Ring Network for RS-232C Based Communications", *TENCON 1989, Fourth IEEE Region 10 Internatinal Conference*, Nov. 22, 1989, pp. 646-649.

* cited by examiner

*Primary Examiner*—David C Payne
*Assistant Examiner*—Tanmay K Shah
(74) *Attorney, Agent, or Firm*—Merchant & Gould P.C.

(57) ABSTRACT

A decoding process, by an electronic circuit of a diphase asynchronous frame carried by an encoded data signal and comprising L information bits followed by at least one stop bit. The process comprises a step for automatically detecting the length L in information bits of the frame so as to decode the entire frame, the length L of the frame being variable from one frame to another and such that $L_{min} \leq L \leq L_{max} = (L_{min}+k)$, where k is a predetermined whole number greater than or equal to one.

20 Claims, 6 Drawing Sheets

Figure 1:
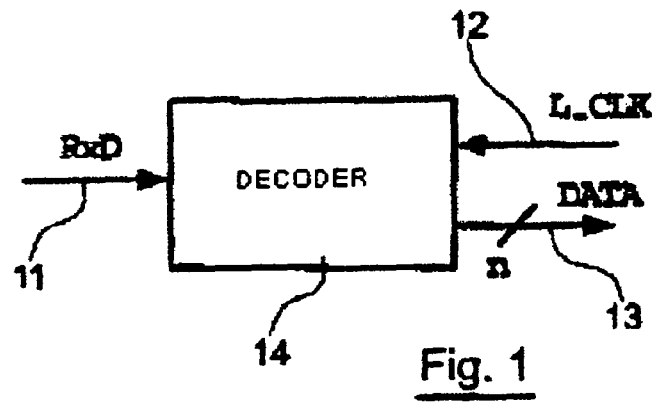

PROCESS AND ELECTRONIC DECODING CIRCUIT FOR A DIPHASE ASYNCHRONOUS FRAME WHOSE LENGTH IS NOT KNOWN IN ADVANCE, CORRESPONDING APPLICATION, COMPUTER PROGRAMME AND STORAGE MEANS

SCOPE OF THE INVENTION

This invention relates to the decoding of digital data organised into frames.

More precisely, the invention relates to diphase asynchronous data frame decoders, in particular those coded using the Manchester code.

The invention may have applications in all fields using Manchester type transmissions, such as that of industrial control or telecommunications, especially when simple, low price decoders are wanted.

For example, the invention may apply to communications in the lighting field, and especially the decoding of diphase asynchronous data frames complying with the DALI protocol (Digital Addressable Lighting Interface). The latter is a standard bus communication protocol (CEI 60929) designed for the communication between lighting equipment and a controller, with simplicity (two wire connection), reliability (digital signals, Manchester coding) and interoperability (equipment of different brands).

PRIOR ART

There are decoding methods for diphase asynchronous data frames (typically Manchester frames). With these decoding methods, the length L in information bits of the frames is imperatively fixed and known in advance by the decoding circuit. In fact traditionally, a diphase asynchronous data frame comprises L information bits, preceded by at least one start bit and followed by at least one stop bit. Thus, for example, the DALI protocol provides that each frame is composed of 1 start bit, 16 information bits (data bits) and 2 stop bits.

To the knowledge of the inventors, as of today there is no technical decoding solution in a new context where the length L of information bits would be variable from one frame to another and unknown in advance by the decoding circuit.

To the knowledge of the inventors, there is no technical solution either permitting the decoder to change its operating mode automatically and in particular to switch from a normal mode to a test mode.

Furthermore, Manchester coding is a technique that has been known for a long while and applied in numerous fields. There are several methods of recovering the corresponding clock in a receiver, and in particular the use of a Phase Locked Loop (PLL) or of a precise clock. However, none of these synchronisation solutions is satisfactory.

With a phase locked loop, the output signal phase is locked onto that of the input signal, which forces the output signal frequency to lock onto the input signal frequency, permitting the slave mode of the frequency, and therefore synchronisation. A major disadvantage of this technique is that during the phase locking which will make the synchronisation possible, the first data transmitted is lost. Another disadvantage of this technique is that it is costly and relatively complex to implement, notably due to the presence of a phase locked loop.

For other remote transmission systems, it is necessary to use a precise clock in order to decode reliably the data received. A major disadvantage of this technique is that it needs the baud rate at the receiver to be known. Furthermore, it requires a precise local clock, both at the transmitter and at the receiver, which makes this technique more costly and complex to implement.

PURPOSES OF THE INVENTION

The purpose of the invention is to solve the various difficulties encountered in the state of the art.

One particular purpose of the invention is to provide a decoding technique for a diphase asynchronous data signal in the new above-mentioned context, where the length L in information bits may vary from one frame to another and that is not known in advance to the decoding circuit.

Another purpose of the invention is to provide such a technique that is simple and affordable.

Another purpose of the invention is to provide such a technique that does not require either a phase locked loop or a precise clock.

ESSENTIAL CHARACTERISTICS OF THE INVENTION

These various purposes as well as others which will become apparent later on are achieved by the invention with the aid of a decoding process, by an electronic circuit of a diphase asynchronous frame carried by an encoded data signal and comprising L information bits followed by at least one stop bit. According to the invention, the process comprises a step for automatically detecting the length L in information bits of the frame so as to decode the entire frame, the length L of the frame being variable from one frame to another and such that $L_{min} \leq L \leq L_{max} = (L_{min}+k)$, where k is a predetermined whole number greater than or equal to one.

The general principle of the invention therefore consists of positioning it in a new context where the frames successively emitted do not all have the same length of information bits and where the decoder does not receive any information in advance informing it of the exact number of information bits included in each frame transmitted, and to allow the decoder to detect the length L of each frame automatically. This avoids the prior transmission to the information decoder of information on the length L of each frame. Thus, the invention is particularly simple and efficient.

Different applications may be envisaged in this new context.

In one particular embodiment of the invention, the said process comprises moreover a step for the selection of an operating mode of the electronic circuit from at least two possible operating modes, depending on the length L detected.

Advantageously, the said at least two operating modes are a normal mode and a test mode.

Advantageously, the said selection step is such that: if the length L detected is equal to $L_{min}$. The normal mode is selected; if the length L detected is equal to $L_{max}$, the test mode is selected.

Advantageously, when the test mode is selected, the electronic circuit treats like a test frame at least one frame received after the frame whose length l has been detected.

Preferably, the automatic detection step of the length L of the frame itself comprises the following successive steps:

a) detection of a possible transition in a portion of the signal carrying the row bit ($L_{min}+P$) where p is a variable of a whole number type that is initialised at 1;

b) if no transition is detected, the row bit ($L_{min}+p$) is considered as a stop bit and the frame is treated as a information bit frame ($L_{min}+p-1$);

c) if a transition is detected, the row bit ($L_{min}$+p) is considered as an information bit and:

c-1) if ($L_{min}$+P)=$L_{max}$, the frame is treated as an information bit frame ($L_{min}$+p);

c-2) if ($L_{min}$+p)<$L_{max}$, we return to step a) after first incrementing p by one to treat a portion of the signal carrying the following bit.

Preferably, step a) itself comprises a windowing step, limiting to a determined time window the detection of a possible transition in the portion of the signal carrying the row bit ($L_{min}$+p).

In a preferred embodiment of the invention, the windowing step uses a counter powered by an internal clock of the said circuit, and that is incremented from zero to a determined maximum value, then decremented from the maximum value to zero. Moreover, the said determined time window is defined as a time interval during which the current value of the counter is greater than or equal to a predetermined threshold.

According to one advantageous characteristic, the said maximum determined value of the counter is a predetermined value dependent on an emission frequency and a data signal transfer rate.

According to one advantageous variant, the said maximum determined value of the counter is read from a register having first memorised the contents of the counter during the detection of a transition in the portion of the data signal carrying the row bit $L_{min}$.

Advantageously, the said predetermined threshold is equal to half of the said maximum determined value of the counter, such that the said time window covers approximately 50% of a binary time.

Advantageously, in the case of the said frame comprising L information bits followed by a first and a second stop bit, then the automatic detection step of the length of the said frame comprises moreover a first step to verify the decision made during step b), to treat the frame as an information bit frame ($L_{min}$+(p−1)), the said first verification step consisting of verifying that the row bit ($L_{min}$+(p+1)) is a second stop bit.

Advantageously, the step for automatically detecting the length of the frame comprises moreover a second step for verifying the decision, made during step c-1), to treat the frame as an information bit frame ($L_{min}$+p), the said second verification step consisting of verifying that the row bit ($L_{min}$+(p+1)) is a stop bit.

In one particular embodiment of the invention, $L_{max}$=($L_{min}$+1) and in that the step for treating the row bit ($L_{max}$ itself comprises the following successive steps:

a') detection of a possible transition in a portion of the signal carrying the row bit $L_{max}$;

b') if no transition is detected, the row bit $L_{max}$ is considered as a stop bit and the frame is treated as a information bit frame $L_{min}$;

c') if a transition is detected, the row bit $L_{max}$ is considered as an information bit and the frame is treated as an information bit frame $L_{max}$;

In one advantageous embodiment of the invention, the said data signal is encoded using Manchester coding.

The invention also relates to a computer programme product, comprising programme code instructions to run decoding process steps according to the invention, when the said programme is run on a computer.

The invention also relates to a storage means, possibly totally or partially removable, that may be read by a computer, storing a set of instructions that may be carried out by the said computer to implement the decoding process of the invention.

The invention further relates to an electronic circuit for decoding a diphase asynchronous frame carried by a data signal and comprising L information bits followed by at least one stop bit, the said circuit comprising means for automatically detecting the length L of the frame so as to detect the entire frame, the length L of the frame being variable from one frame to another and such that: $L_{min} \leq L \leq L_{max}$, where $L_{max}=(L_{min}+k)$, where k is a predetermined whole number greater than or equal to one.

Advantageously, the said circuit comprises moreover means for selecting an operating mode for the electronic circuit from at least two possible operating modes, according to the length L detected.

The invention also relates to a control device for at least one piece of equipment, this device comprising an electronic decoding circuit according to the invention.

Advantageously, the equipment controlled is lighting equipment.

LIST OF FIGURES

Figure 4:
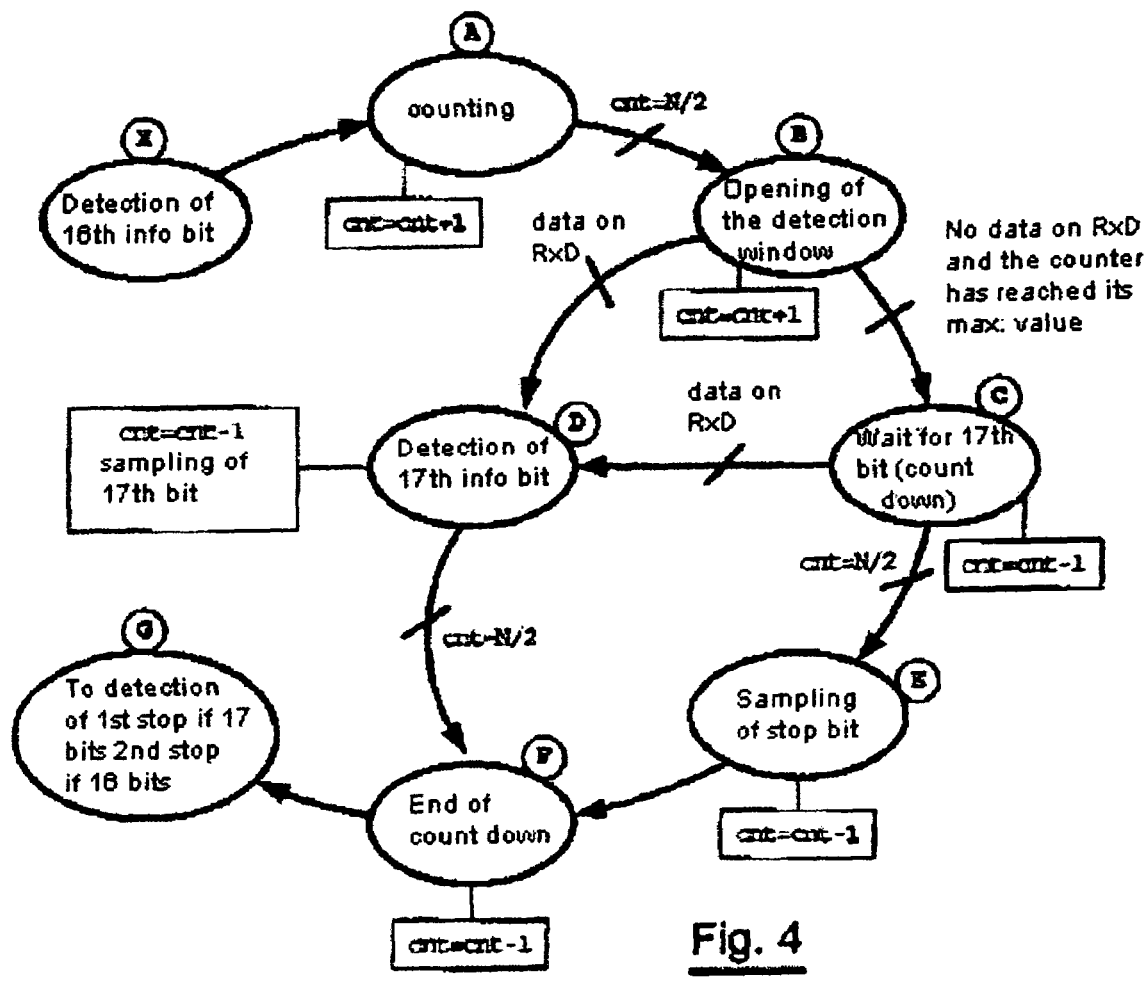
Figure 2:
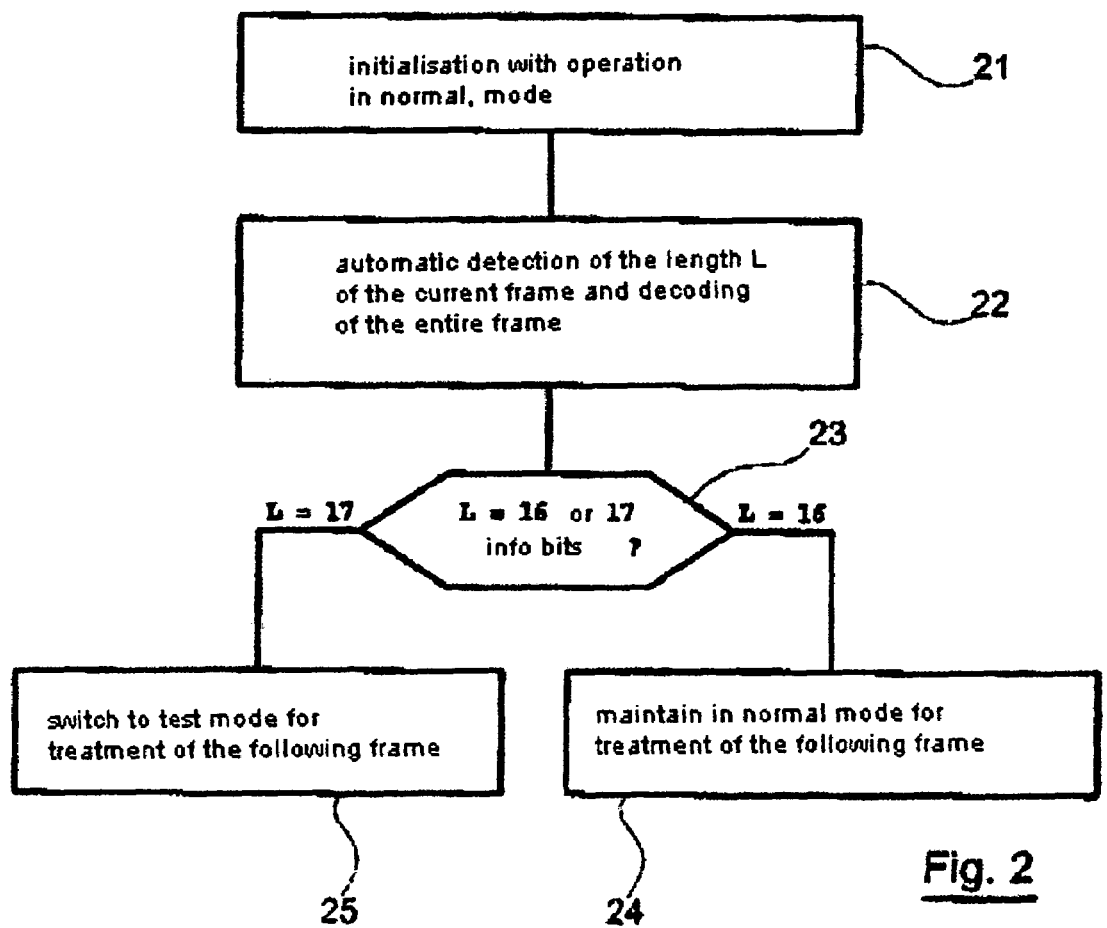
Figure 3:
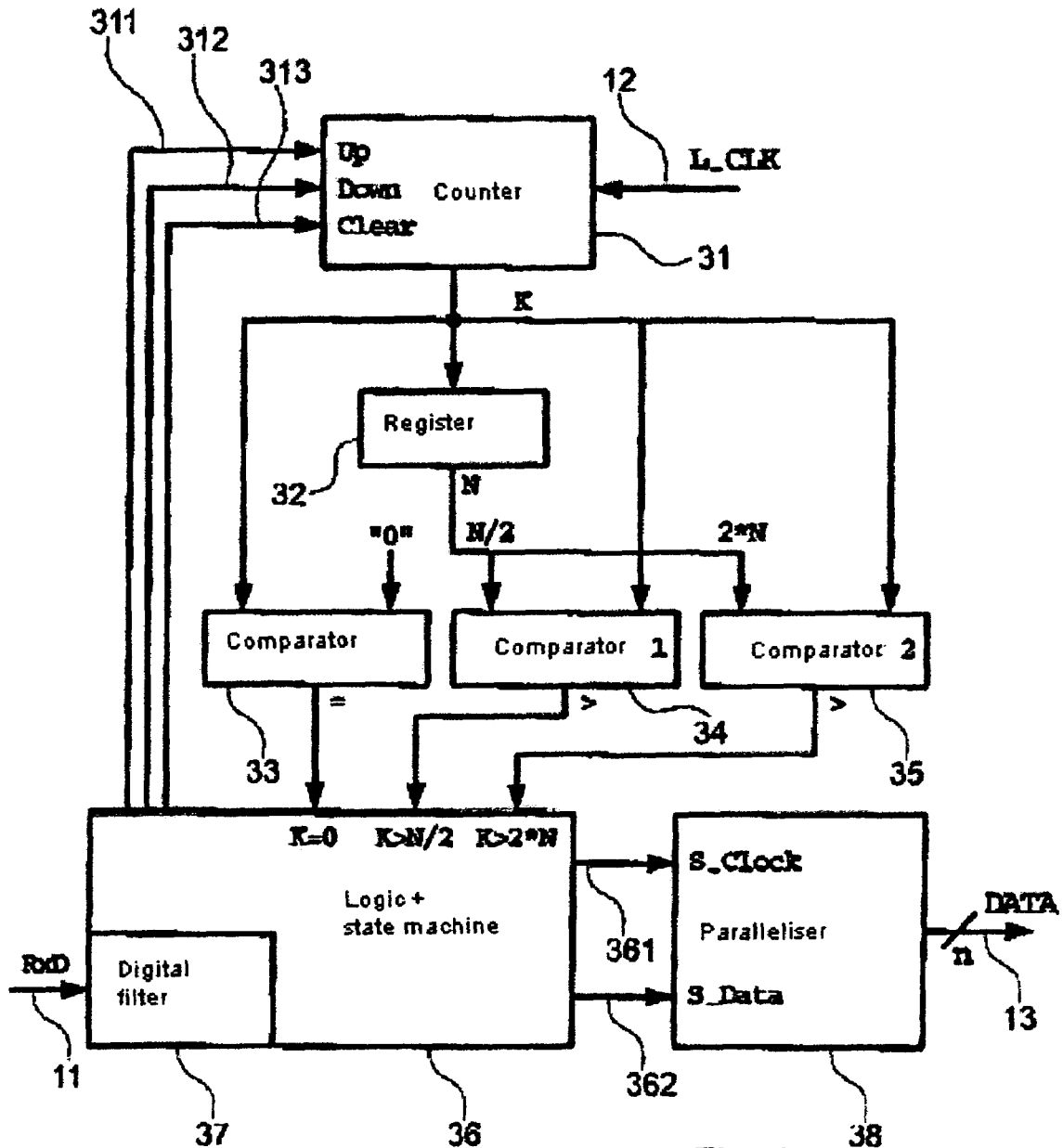
Figure 5:
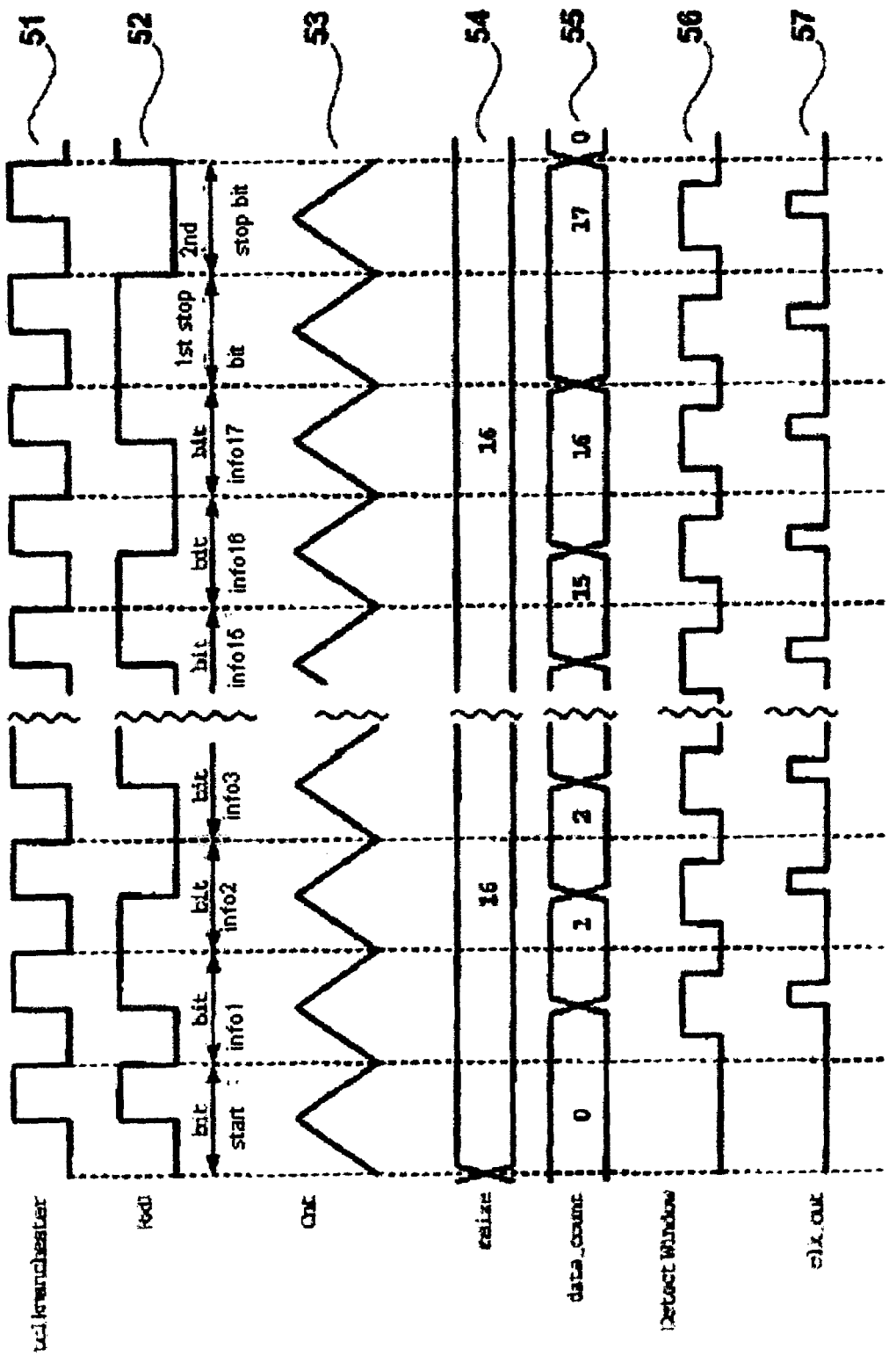
Figure 6:
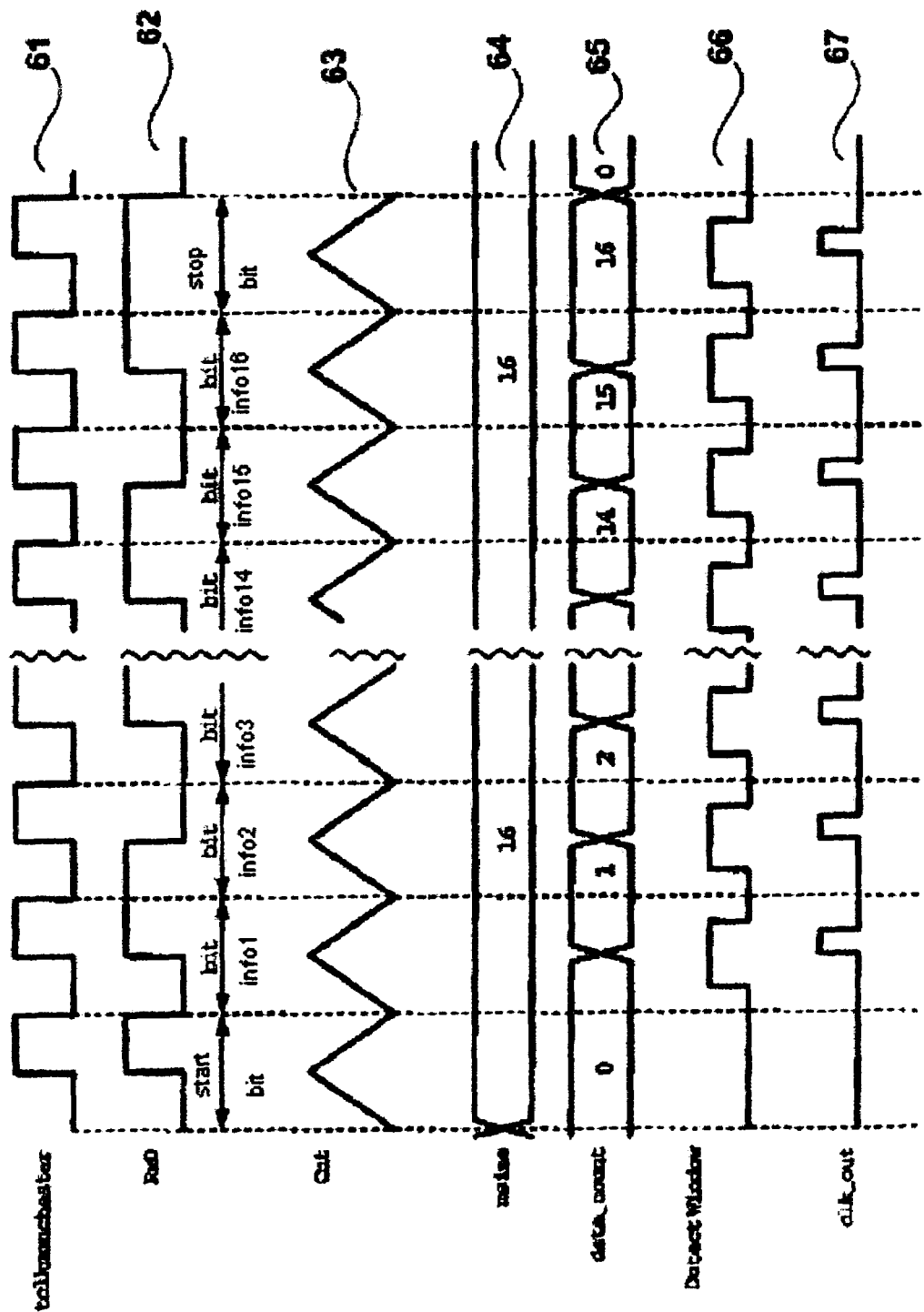
Figure 7:
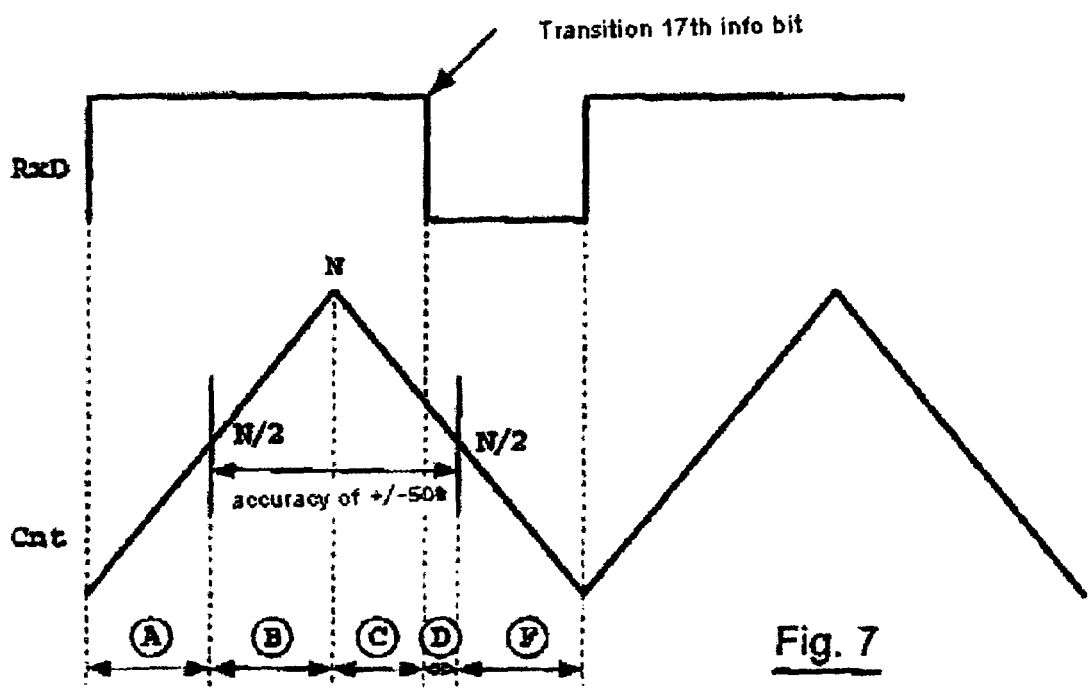
Figure 8:
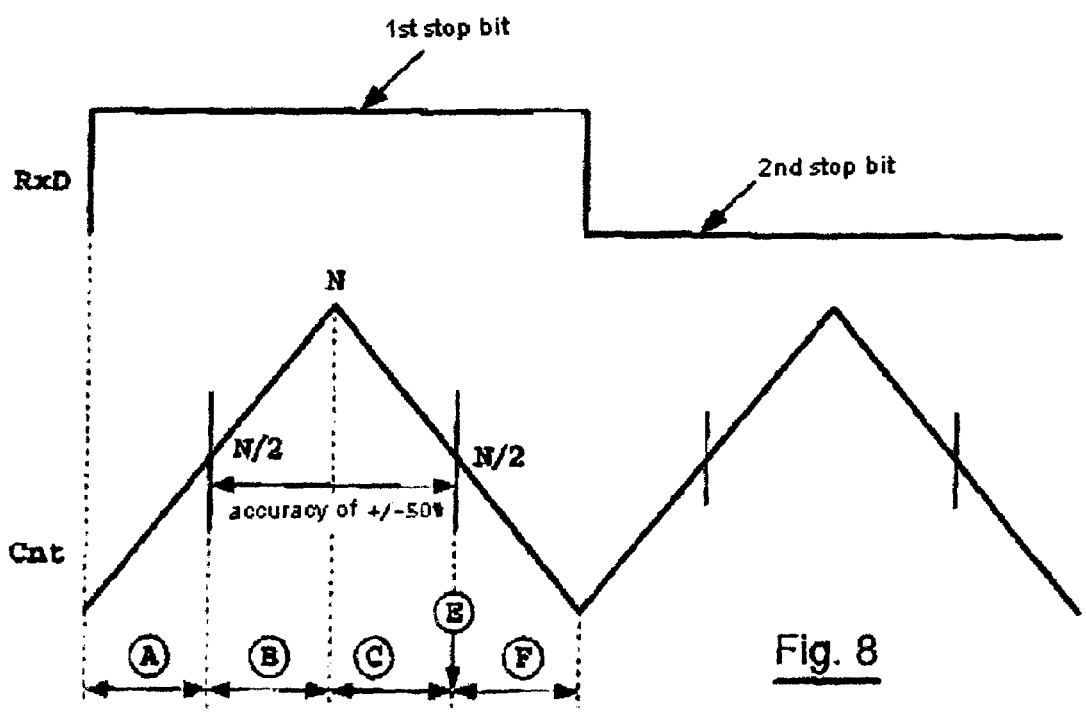

Other characteristics and advantages of the invention will become apparent after reading the following description of a preferred embodiment of the invention, provided by way of non-restrictive example and in the appended drawings, in which:

FIG. 1 presents a general diagram of a decoder of a frame encoded using Manchester coding;

FIG. 2 presents an organisation chart of a particular embodiment of the process of the invention;

FIG. 3 describes the operation of the decoder of FIG. 1, according to the invention in the form of a block diagram;

FIG. 4 presents a state machine detailing a particular embodiment of the step for automatically detecting the length of a frame, appearing on the organisation chart of FIG. 2;

FIG. 5 presents a chronogram of the various input/output signals and intermediate signals of the diagram of FIG. 3, in the case of a frame comprising 17 information bits and two stop bits;

FIG. 6 presents a chronogram of the various input/output signals and intermediate signals of the diagram of FIG. 3, in the case of a frame comprising 16 information bits and two stop bits;

FIG. 7 presents in detail an example of a detection of a 17$^{th}$ information bit;

FIG. 8 presents in detail the detection of a first and a second stop bit.

DESCRIPTION OF AN EMBODIMENT OF THE INVENTION

The general principle of the invention is based on an electronic circuit for decoding a diphase asynchronous frame permitting the data transmitted and their transmission clock to be recovered at the output, regardless of the length in information bits of each frame.

The invention uses a simple counter and does not require a precise clock or a phase locked loop. This electronic circuit can in particular automatically adapt to any transmission rate, even variable, even if it does not know the internal clock precisely. For this, it is sufficient to use a sufficiently deep counter to adapt to a relatively low transmission rate, and a local clock sufficiently quick with respect to a higher transmission speed.

In the invention it is considered that the data frame received at the decoder level is of the asynchronous type, as it is composed of a series of asynchronous binary elements from the receiver. It is also of the diphase type as the data bits are not encoded by states but by transition bits. This coding is known as Manchester coding.

The inputs and outputs of the decoder 14 are presented in relation to FIG. 1.

This decoder 14 has two inputs, the first 11 to which are sent the diphase asynchronous frames (noted RxD on the figure) and the second 12 corresponding to the local clock input (L_CLK on the figure), still called internal clock. In the embodiment described, the local clock may have an imprecise frequency, but greater than 16 times the rate of the date to be decoded.

This decoder 14 also has an output 13 which permits the decoded DATA, placed in parallel on a width on n bits, the number n varying according to the application.

The signal transmitted is organised into frames. The diphase asynchronous frames received on the RxD input 11 of the decoder 14 are composed of a start bit followed by information bits and end by one or more stop bits. The start bit and the information bits are not encoded by states but by transitions, as illustrated in FIGS. 5 and 6. In return, the stop bits are encoded by states (which is to say by levels).

Therefore, according to the Manchester coding, the information bits equal to '1' are coded by rising fronts and the information bits equal to '0' are coded by descending fronts. The start bit is also encoded using Manchester coding.

It is of course understood that the invention presented also applies to any other type of coding where the bits are encoded by transitions and not by states. It would therefore be possible, in another embodiment, to encode the information bits equal to '1' by descending fronts and the information bits equal to '0' by rising fronts.

In the absence of transmission or between the data, an inactive condition is maintained during which there are no transitions.

We will now present in relation to the organisation chart of FIG. 2, a specific embodiment of the process according to the invention.

The decoder is first initialised in a normal operating mode (step 21). Then the decoder automatically detects the length L in information bits of the current frame and carries out the decoding of this entire current frame (step 22). If the length L detected takes a first value (for example 16, corresponding to a classic DALI frame, which is to say in compliance with the DALI protocol (first case of output of step 23), the decoder maintains its normal operating mode for the treatment of one of more following frames (step 24). If the length L detected takes a second value (for example 17, corresponding to a modified DALI frame, not provided for in the DALI protocol as it is specified as of today) (second case of output of step 23), the decoder passes from the normal operating mode to a test mode for the treatment of one or more following frames (step 25).

Thus, via this example, the invention permits the extension of the current DALI protocol by introducing the use of a second type of frame, comprising 17 information bits instead of 16. This permits the DALI bus to transmit specific information different from a standard DALI transmission, such as for example specific test data. If a frame transmitted comprises 16 information bits, then the decoder will detect a standard DALI frame and treat it as such. However, if a frame transmitted comprises 17 bits, the first 16 information bits will be treated as standard information bits and the 17$^{th}$ bit will indicate to the decoder that the following frames will not be standard DALI frames but test frames. These test frames may then be treated consequently.

We will now present more precisely, in relation to FIG. 3, the block diagram of the decoder 14 already discussed in relation to FIG. 1.

In a preferred embodiment, this decoder 14 is composed of:
a counter 31 that may be incremented or decremented;
a register 32 used to store the value of the counter 31 at a given moment (subsequently, the register value is noted "N" and the counter value is noted "K" or "cnt");
a comparator 33 comparing the value of the counter 31 to zero, called a zero comparator;
two other comparators called first comparator 34 and second comparator 35;
a "Logic and State Machine" block 36;
a digital filter 37;
a paralleliser 38.

In general, the width of the counter 31 and that of the register 32 are provided by the ratio between the baud rate of the data signal and the value of the local clock. For example, with data at 1200 bauds and a local clock at 1 MHz, the counting capacity must be greater than $$\frac{10^6}{2400},$$

which is to say 416, which defines a 9 bit counter. To allow the tolerances on the data and the local clock to be absorbed (±10% for example) and implement frame error detection, the use of at least a ten bit counter is recommended.

The digital filter 37 at the input of the assembly is intended to improve the decoding by allowing parasites to be rejected, thus avoiding the decoder 14 confusing a parasite with a transition. To do so, several successive signal samples may be taken into account, for example three. Depending on the level of these three successive samples, it can be decided whether they correspond to a transition (rising or descending front) or a parasite.

The paralleliser 38 permits the decoded data signal 13 to be reconstructed, composed of decoded data on a width of n bits, where the number n depends on the application.

In the aim of simplifying things, in the case of the decoder receiving frames that each have a start bit, in the rest of the description 16 or 17 information bits and one or two stop bits can be inserted. In other terms, in this example the decoder receives two types of frames: classic DALI frames (16 information bits) and modified DALI frames (17 information bits).

The choice of the number of stop bits included in a given frame is made for example according to the transfer rate, which is to say the speed at which the frame is treated with respect to the time of the stop bit(s).

It is clear however that the invention may be used with other frame structures. Generally, the decoder of the invention is capable of treating frames that have a length L of information bits that is variable from one frame to the next, and such that $L_{min} \leq L \leq L_{max}$ where $L_{max} = (L_{min} + k)$ where k is a predetermined whole number equal to or greater than one.

We will successively present below the two treatment phases of a frame by the decoder, in a normal operating mode (see discussion above). In the first phase, the decoder treats the start bit and the first 16 information bits. In the second phase, the decoder treats the following bits (possible 17$^{th}$ information bit and the stop bit(s)).

Treatment of the Start Bit and the First 16 Information Bits

During the inactive state preceding the start bit, the counter 31 is maintained at the value zero. The zero comparator 33 comparing the counter 31 output with the value zero is therefore in a "real" position, and this information is transmitted to the "Logic and State Machine" block 36. Nothing happens: the transmission line is in an inactive state. In this position, the counter 31 is at zero, under the action of a zero reset command 313 (called clear).

During the first descending front, the counter 31 receives a command 311 (called "up") from the "Logic and State Machine" block 36, launching an incrementation of the counter until the detection of a new transition in the data signal (coding the start bit). The current value K of the counter 31 is then stored in the register 32 (the value N of the register is equal to K). When it detects this transition, the "Logic and State Machine" block 36 sends a decrementation command 312 (called "down") so that the counter 31 goes back in the other direction.

When the zero comparator 33 detects that the counter 31 has reached the zero value, the latter returns again to the rising direction, under the action for example of the logic defined in the "Logic and State Machine" block 36. At the next transition (coding the first information bit), the new value of the counter 31 is stored in the register 32 and the counter 31 is again decremented down to zero.

This is repeated for each of the following information bits, up to the sixteenth. It is then possible to assimilate the counting value at the output of the counter to a saw tooth signal, the peaks of each of the teeth corresponding to the transitions in the data signal. It is from these transitions that the decoding clock and decoded data will be recovered.

In this preferred embodiment described, the circuit also comprises two other comparators 34 and 35, permitting the decoding performances to be improved.

The first comparator 34 permits the value K of the counter 31 to be compared to the value N of the register 32 divided by two (k>N/2?). When the value K of the counter 31 is greater than N/2, a detection window is created, authorising the transition detection in this window. Such a window covers approximately 50% of a binary time and is centred on the transition. This first comparator 34 therefore permits the system to be made sturdier, as it reduces the probability of false detections and prevents detection on inter-bit fronts when the consecutive bits are of the same value.

The second comparator 35 allows the value k of the counter 31 to be compared to the value N of the register 32 multiplied by 2 (K>2*N?). This comparison makes it possible to detect if transitions are still being received, and therefore if the transmission is not interrupted. The sturdiness of the decoder is therefore again improved.

Finally, in this embodiment described, the "Logic and State Machine" block 36 will permit two signals to be recovered, a decoding clock signal 361 and an intermediate decoded data signal 362, called S-Clock and S-Data on the block diagram.

This "Logic and State Machine" block 36 intervenes at different steps during the decoding; its role is to detect the changes of fronts on the diphase asynchronous data signal to be decoded, to count the number of bits received according to the application and to manage the counter 31 and the register 32, taking account of the three comparators 33, 34 and 35.

Treatment of the Following Bits (Possible $17^{th}$ Information Bit and Stop Bit(s).

The treatment of the following bits corresponds to the step for automatically detecting the length of a frame (reference 22 on the organisation chart of FIG. 2).

We will now present a specific embodiment, in relation to the State Machine of FIG. 4.

In the "X state, the decoder detects the $16^{th}$ information bit (end of the first treatment phase described above) then passes to state "A".

In state "A", the decoder increments the counter 31 (cnt=cnt+1). When the value cnt of the counter 31 becomes greater than N/2, then it passes to the state "B" where a detection window is opened and the incrementation of the counter continues.

It is reminded that N is equal to the maximum value of the counter, at the moment when the transition coding the $16^{th}$ information bit was detected. In a variant of the embodiment, N is replaced by a predetermined maximum value depending on an emission frequency and a data signal transfer rate.

From the state "B", if a transition is detected in the signal received (on the RxD input) before the counter reaches the maximum value N, a switch is made to the state "D", in which the bit following the $16^{th}$ information bit is treated and sampled as a $17^{th}$ information bit. Furthermore, the decrementation of the counter is started.

From the state "D", when the value cnt of the counter 31 becomes lower than N/2, a switch is made to the state "F", where the detection window is closed and the decrementation of the counter continues.

From the state "B", if no transition is detected in the signal received before the counter reaches maximum value N, a switch is made to the state "C", in which the decrementation of the counter is started and a possible transition is still awaited.

From the state "C", if a transition is detected in the signal received before the counter reaches the value N/2, a switch is made to the state "D" already mentioned earlier.

From the state "C", if the value cnt of the counter 31 becomes lower than N/2, without any transition being detected in the signal received, a switch is made to the state "E", where the bit following the $16^{th}$ information bit is treated and sampled as a stop bit. Then a switch is made to the state "F", already mentioned earlier (closure of the detection window and the decrementation of the counter continues).

From the state "F", a switch is made to the state "G", for the treatment of the first or second stop bit, depending on whether the bit following the $16^{th}$ information bit is treated as a $17^{th}$ information bit (see state "D") or as a stop bit (see state "E").

FIG. 7 presents in detail an example of detection of a $17^{th}$ information bit. The signal received on the RxD input (top line), the cnt value of the counter (middle line) as well as the successive states of the state machine (bottom line) have been shown. In this example, a transition is detected when the value of the counter is included between N and N/2. The $17^{th}$ information bit is here taken into account before the counter drops down to N/2. The successive states are therefore: "A", "B", "C", "D" and "F".

FIG. 8 presents in detail the detection of a first and a second stop bit. Once again, the signal received on the RxD input (top line) the cnt value of the counter (middle line) as well as the successive states of the state machine (bottom line) have been shown. In this example, no transition is detected during the detection window of the nature of the bit following the $16^{th}$ information bit (which is to say neither during the rising phase of the counter, from N/2 to N, nor during the descending phase from N to N/2. The first stop bit is here taken into account when the counter reaches N/2. The successive states are therefore: "A", "B", "C", "E" and "F". The detection of the second stop bit is carried out in the same way as for the first stop bit.

FIGS. 5 and 6 permit easier visualisation of the operation of the decoder 14, by each presenting a chronogram of the various input and output signals and intermediate signals at the decoder (see FIG. 3). FIG. 5 corresponds to the case of a frame comprising 17 information bits and two stop bits. FIG. 6 corresponds to the case of a frame comprising 16 information bits and one stop bit.

On the first line 51, 61, the clock signal used for the coding ("tclkmanchester") also sought to be reconstituted in the decoder, has been shown.

On the second line, 52, 62, the signal received on the decoder input (Rxd), has been shown.

On the third line, 53, 63, the current value of the counter (cnt), has been shown.

On the fourth line, 54, 64, the Manchester reception machine state progress parameters ("msize"), have been shown.

On the fifth line, 55, 65, the data count has been shown.

On the sixth line, 56, 66, a signal representing the detect windows has been shown.

On the seventh line, 57, 67, the reconstituted clock ("clk_out"), has been shown.

The invention claimed is:

1. Decoding process, by an electronic circuit of a diphase asynchronous frame carried by an encoded data signal and comprising L information bits followed by at least one stop bit, wherein said decoding process comprises a step for automatically detecting the length L in information bits of the frame so as to decode the entire frame, the length L of the frame being variable from one frame to another and such that $L_{min} < L < L_{max} = (L_{min}+k)$, where k is a predetermined whole number greater than or equal to one, wherein the step for automatically detecting the length L comprises itself the followings steps:
   a) detection of a possible transition in a portion of the signal carrying the row bit ($L_{min}+p$) where p is a variable of a whole number type that is initialized at 1;
   b) if a transition is detected, the row bit ($L_{min}+p$) is considered as an information bit and:
      b-1) if ($L_{min}+p$)=$L_{max}$, the frame is treated as an information bit frame ($L_{min}+p$);
      b-2) if ($L_{min}+p$)<$L_{max}$, return to step a) after first incrementing p by one to treat a portion of the signal carrying the following bit,
   and in that the step for automatically detecting the length of the frame comprises moreover a first step for verifying the decision, made during step c-1), to treat the frame as an information bit frame ($L_{min}+p$), the said second verification step consisting of verifying that the row bit ($L_{min}+(p+1)$) is a stop bit.

2. Process of claim 1, wherein it comprises moreover a step for the selection of an operating mode of the electronic circuit from at least two possible operating modes, depending on the length L detected.

3. Process of claim 2, wherein the said at least two operating modes are a normal mode and a test mode.

4. Process of claim 3, wherein the said selection step is such that: if the length L detected is equal to $L_{min}$, the normal mode is selected; if the length L detected is equal to $L_{max}$, the test mode is selected.

5. Process of claim 3, wherein when the test mode is selected, the electronic circuit treats like a test frame at least one frame received after the frame whose length L has been detected.

6. Process of claim 1, wherein the automatic detection step of the length L of the frame itself comprises the following successive steps:
   c) if no transition is detected, the row bit ($L_{min}+p$) is considered as a stop bit and the frame is treated as a information bit frame ($L_{min}+(p-1)$), and in that said steps a and b of claim 1 are iterated successively.

7. Process of claim 6, wherein the step a itself comprises a windowing step, limiting to a determined time window the detection of a possible transition in the portion of the signal carrying the row bit ($L_{min}+p$).

8. Process of claim 7, wherein the windowing step uses a counter powered by an internal clock of the said circuit, and that is incremented from zero to a determined maximum value, then decremented from the maximum value to zero, and in that the said determined time window is defined as a time interval during which the current value of the counter is greater than or equal to a predetermined threshold.

9. Process of claim 8, wherein the said maximum determined value of the counter is a predetermined value dependent on an emission frequency and a data signal transfer rate.

10. Process of claim 8, wherein the said maximum determined value of the counter is read from a register having first memorized the contents of the counter during the detection of a transition in the portion of the data signal carrying the row bit $L_{min}$.

11. Process of claim 8, wherein the said predetermined threshold is equal to half of the said maximum determined value of the counter,, such that the said time window covers approximately 50% of a binary time.

12. Process of claim 6, the said frame comprising L information bits followed by a first and a second stop bit, wherein the automatic detection step of the length of the said frame comprises moreover a second step to verify the decision made during step c), to treat the frame as an information bit frame ($L_{min}+(p-1)$), the said first verification step consisting of verifying that the row bit ($L_{min}+(p+1)$) is a second stop bit.

13. Process of claim 6, wherein $L_{max}=(L_{min}+1)$ and in that the step for treating the row bit $L_{max}$ itself comprises the following successive steps:
   a') detection of a possible transition in a portion of the signal carrying the row bit $L_{max}$;
   b') if no transition is detected, the row bit $L_{max}$ is considered as a stop bit and the frame is treated as a information bit frame $L_{min}$;
   c') if a transition is detected, the row bit $L_{max}$ is considered as an information bit and the frame is treated as an information bit frame $L_{max}$.

14. Process of claim 1, wherein the said data signal is encoded using Manchester coding.

15. Computer program product, wherein it comprises program code instructions to run the steps of the process of claim 1, when the said program is run on a computer.

16. Storage means, possibly totally or partially removable, that may be read by a computer, storing a set of instructions that may be carried out by the said computer to implement the process of claim 1.

17. Electronic circuit for decoding a diphase asynchronous frame carried by a data signal and comprising L information bits followed by at least one stop bit, wherein said electronic circuit comprising means for automatically detecting the length L of the frame in information bits of the frame so as to decode the entire frame, the length L of the frame being variable from one frame to another and such that: $L_{min} \leq L \leq L_{max} = (L_{min}+k)$, where k is a predetermined whole number greater than or equal to one, and in that said means for automatically detecting the length L of the frame comprise:
   means for detecting a possible transition in a portion of the signal carrying the row bit ($L_{min}+p$) where p is a variable of a whole number type that is initialized at 1;

means for estimating the row bit ($L_{min}+p$) as an information bit, said means for estimating being activating if a transition is detected;

means for treating the frame, said means for treating being activating if a transition is detected and enabling to come to at least one of the following decisions:

c-1) if ($L_{min}+p$) =$L_{max}$, treating the frame as an information bit frame ($L_{min}+p$);

b-2) if ($L_{min}+p$) <$L_{max}$, activating again said means for detecting by having incrementing p by one to treat a portion of the signal carrying the following bit, and in that said means for automatically detecting the length L of the frame comprise moreover first means for verifying the decision c-1 for treating the frame as an information bit frame ($L_{min}+p$), said means of verifying comprising second means for verifying that the row bit ($L_{min}+(p+1)$) is a stop bit.

18. Electronic decoding circuit of claim 17, wherein it comprises moreover means for selecting an operating mode for the electronic circuit from at least two possible operating modes, according to the length L detected.

19. Control device for at least one piece of equipment, wherein it comprises an electronic decoding circuit of claim 17.

20. Control device of claim 19, wherein the equipment controlled is lighting equipment.

\* \* \* \* \*